(12) United States Patent
Gaillardon et al.

(10) Patent No.: US 8,861,254 B2
(45) Date of Patent: Oct. 14, 2014

(54) MEMORY CELL

(75) Inventors: Pierre-Emmanuel Gaillardon, Romans (FR); Giovanni Betti Beneventi, Rovigo (IT); Luca Perniola, Noyarey (FR)

(73) Assignees: Commissariat a l'Energie Atomique et aux Energies Alternatives, Paris (FR); Institut Polytechnique de Grenoble, Grenoble (FR)

( * ) Notice: Subject to any disclaimer, the term of this patent is extended or adjusted under 35 U.S.C. 154(b) by 273 days.

(21) Appl. No.: 13/419,807

(22) Filed: Mar. 14, 2012

(65) Prior Publication Data

US 2012/0236626 A1 Sep. 20, 2012

(30) Foreign Application Priority Data

Mar. 15, 2011 (FR) ...................................... 11 52127

(51) Int. Cl.
*G11C 11/20* (2006.01)
*H01L 27/24* (2006.01)
*H01L 45/00* (2006.01)

(52) U.S. Cl.
CPC ........... *H01L 27/2445* (2013.01); *H01L 45/144* (2013.01); *H01L 45/126* (2013.01); *H01L 45/06* (2013.01); *H01L 45/04* (2013.01); *H01L 45/148* (2013.01); *H01L 27/2472* (2013.01); *H01L 45/146* (2013.01); *H01L 45/1641* (2013.01); *H01L 45/1233* (2013.01)
USPC .......................................... 365/148; 365/163

(58) Field of Classification Search
CPC .................... G11C 2213/79; G11C 13/0007
USPC ........................................ 365/148, 163, 51, 63
See application file for complete search history.

(56) References Cited

U.S. PATENT DOCUMENTS

| 7,453,081 | B2 * | 11/2008 | Happ et al. .................... 257/3 |
| 7,511,532 | B2 | 3/2009 | Derharcobian et al. |
| 2003/0111679 | A1 | 6/2003 | Kuge |
| 2010/0188892 | A1 * | 7/2010 | Baks ............................. 365/163 |
| 2010/0259961 | A1 | 10/2010 | Fasoli et al. |
| 2012/0032136 | A1 * | 2/2012 | Redaelli et al. .................. 257/5 |

FOREIGN PATENT DOCUMENTS

| FR | 2 291 609 | 6/1976 |
| WO | 2010/082923 | 7/2010 |

OTHER PUBLICATIONS

Myoung-Jae Lee, et al., "2-stack 1D-1R Cross-point Structure with Oxide Diodes as Switch Elements for High Density Resistance RAM Applications", 2007, pp. 771-774.
Roberto Bez, "Chalcogenide PCM: a Memory Technology for Next Decade", 2009, pp. 5.1.1-5.1.4.

(Continued)

*Primary Examiner* — Vu Le
(74) *Attorney, Agent, or Firm* — Oblon, Spivak, McClelland, Maier & Neustadt, L.L.P.

(57) ABSTRACT

The present invention is a non-volatile memory cell containing at least two distinct memory zones, each formed in a resistivity-change material, the memory cell containing at least one heating element for each memory zone, each heating element having at least two ends, one of which is connected to a supply line and the other of which is brought into contact with the resistivity-change material, characterized in that the resistivity-change material is arranged in a single block common to each of the memory zones of the memory cell, so as to create distinct memory zones locally.

22 Claims, 5 Drawing Sheets

(56) References Cited

OTHER PUBLICATIONS

Kazuhiro Yamamoto, et al., "XPS Study of Silicon Surface After Ultra-Low-Energy Ion Implantation", Surface Science 600 (2006), pp. 3753-3756.

Dieter K. Schroder, "Semiconductor Material and Device Characterization", $3^{rd}$ Edition IEEE Press, 2006, pp. 38-41 and 61-63.

Ki-Bong Song, et al., "Chalcogenide Thin-Film Transistors Using Oxygenated n-type and p-type Phase Change Materials", Applied Physics Letters (APL), 93, 2008, pp. 043514-043514-3.

* cited by examiner

Prior art

MEMORY CELL

TECHNICAL FIELD OF THE INVENTION

The present invention relates in general to non-volatile memories containing resistive elements. More particularly, it describes a memory cell and its access device obtainable at the end of the method for manufacturing a standard semiconductor component of integrated-circuit type.

PRIOR ART

Memories containing resistive elements use a material that can switch reversibly between at least two stable states having different electrical resistances. Examples are phase-change memories. In this case, their constituent material is made to evolve between an amorphous state and a crystalline state. The amorphous state has higher resistivity than the crystalline state, thus making it possible to define at least two states of the memory cell and therefore to store therein at least one information bit: 1 or 0. The amount of information that can be stored in a memory cell increases with the number of resistive states that can be programmed. For example, if four resistive states can be defined reproducibly, two information bits can be stored per memory cell. This type of memory cell has the advantage of being non-volatile. The phase of the material and therefore the stored information are not altered by the absence of power supply in the circuit. It is actually a temperature change that determines the transition from one resistive state to another resistive state during programming of the device. By making a current flow in the phase-change material, its heating and cooling are controlled, as is therefore its final resistive state.

In the case of phase-change memories, the material that permits these controlled changes of resistive states is typically a chalcogenide, especially an alloy of germanium (Ge), antimony (Sb) and tellurium (Te), known by the acronym GST and the chemical composition of which is: $Ge_2Sb_2Te$. Other types of resistive memories exist, denoted overall by the name RRAM, acronym for the English "resistive random access memory", or in other words: "resistive memory with random access." Especially the memories known as "OxRAM", which use metal oxides (Ox) as material whose resistance can be controlled reversibly.

The area of application of non-volatile resistive memories possibly covers all the applications already covered by the existing non-volatile memories; especially the memories of the flash type. By virtue of their access time and their ease of writing, they may also replace the traditional static memories or SRAM, from the English "static random access memory", with the advantage that they do not need to be reinitialized during each reboot, for example from an auxiliary memory of flash type or from a hard disk, as is currently necessary in numerous applications.

A known structure using phase-change resistive elements is illustrated in FIGS. 1a and 1b. Memory cell 10 according to this example comprises the two devices 11 and 13, each including a portion separated by a phase-change material 14. The resistivity of each of the portions may be modified reversibly by making a controlled current pass through devices 11 and 13. Patterns 16, 16, situated underneath the two portions of phase-change material 14, 14, constitute heating means capable of locally producing the heat necessary for the phase-change material to transition from one resistive state to another stable resistive state. The patterns situated above the two portions of phase-change material 14, 14 are the upper electrodes 12, 12 of devices constituting the memory cell and are connected to two supply lines, which may be connected to two different supply voltages, denoted here by Vdd and Vss, of the integrated circuit.

The programming of the memory cell, or in other words the writing thereof, necessitates that one access device be present for each memory cell, in order to control the current that will be made to flow through one and the other of devices 11 and 13 so as to cause the portions of the phase-change material 14, 14 to transition from one resistive state to another with the aid of heating means 16, 16.

Conventionally, this access means is a transistor 30, which must then be implanted in the underlying circuits. In this case, the MOS transistor will be made conductive in writing mode by applying a voltage to its control gate 31, so as, in this example, to make the programming current flow between supply line Vdd and ground for device 11 on the one hand and between supply line VSS and ground for programming of device 13 on the other hand.

Since the entire microelectronics industry is dominated by the constant need to have to increase the integration density of the devices produced, the structures of the type of those described above, employing materials whose resistive state may be varied, are not exempt from this rule.

The object of the present invention is to meet at least this need.

SUMMARY

For this purpose, according to one aspect of the invention, there is provided a non-volatile memory cell containing at least two memory zones, each formed in a resistivity-change material configured to change state reversibly between at least two stable states having different electrical resistances, the memory cell containing at least one heating means, also referred to as heating element and associated with each memory zone, each heating means having at least two ends, one of which is connected to a supply line and the other of which is brought into contact with the resistivity-change material. Characteristically, the resistivity-change material is arranged in a single block common to each of the memory zones of the memory cell, so as to create each of the memory zones locally, each of the memory zones being distinct from the other memory zones.

In this way, a given block of resistivity-change material, common to the entire memory cell, forms each of the memory zones. The invention therefore makes it possible to reduce the size of a memory cell substantially. The memory density of systems integrating cells according to the invention thus may be significantly increased.

In addition, and advantageously, by the provision of making a single block of resistivity-change material available for the entire cell, the invention makes it possible to facilitate production of the memory cell considerably.

Advantageously, the memory cell comprises an access transistor for programming the memory cell. Particularly advantageously, the transistor comprises a collector formed by the single block of resistivity-change material. Thus the resistivity-change material comprises at least partly an access transistor for programming the memory cell. This characteristic makes it possible to increase the integration density of memory cells considerably.

The memory cell of the invention is therefore autonomous and may be obtained at the end of a method for an integrated circuit by the fact, on the one hand, that the collector of the access transistor is made of the resistivity-change material itself and, on the other hand, because the base and emitter are made of oxides that may be deposited at sufficiently low temperatures compatible with the operations performed at the end of the manufacturing line, when the metallic interconnections have already been formed.

This embodiment does not necessitate addition of particular means into the integrated circuit, either for reading of stored information or for programming it.

This advantage is explained below by comparison with the known phase-change memory cells.

In the known phase-change memory cells, such as that illustrated in FIG. 1a and discussed above, the type of resistivity-change material that must be used is poorly suited to its integration in the preliminary steps of the complex process for manufacturing integrated circuits. In fact, with the known processes, based substantially on the silicon technology developed since the origin of the first integrated circuits in the nineteen sixties, a very large number of preliminary steps of manufacture, generally referred to as FEOL from the English "front end of line", or in other words those from "start of the line", would be potentially destructive, especially because they require very elevated temperatures for their implementation. These steps are, for example, the thermal growth of silicon dioxide or the diffusion of impurities for doping semiconductor zones. In contrast, those referred to as BEOL, from the English "back end of line", or in other words "end of the line", which consist substantially in the formation of interconnections between components, take place at much lower temperature. The method of the invention, which is applied after BEOL, is then compatible.

Furthermore, it must be noted that it is often architecturally very advantageous during the design of an integrated circuit to be able to arrange the memory blocks necessary for its functioning as close as possible to their use, in order to limit the length of interconnections and the access times. For example, the reprogrammable logic circuits in their environment commonly denoted by their acronym PLD (Programmable Logic Devices), the best known of which are the FPGAs, from the English "field programmable gate array", are particularly representative of this constraint. Typically, these circuits effectively use a large number of lookup tables and routing units, which define the programmable interconnections between components. That takes the form of small static memories, which are used to personalize each of the logic blocks and their interconnections in order to achieve the desired logic function. It has proved to be preferable that each of the personalization memories is situated as close as possible to the corresponding personalizable logic block in order to limit the length of interconnections and obtain good performances. The replacement of these personalization memories by non-volatile phase-change memories is particularly advantageous, because it is then no longer necessary, upon each reboot, to reload the programming of the individual memories, or in other words the lookup tables and the routing units that define the logic and the interconnections. This operation is lengthy and demands that the personalization be stored in memory in a non-volatile external storage means.

It would therefore be particularly advantageous to be able to produce phase-change memory cells at the end of the method for manufacturing a traditional integrated circuit, or in other words after the last of the steps that would be capable of damaging this type of memory as a consequence of the resistivity-change material used.

It would also be particularly advantageous to be able to place these memories freely, especially as close as possible to the logic blocks that use them, without having to introduce specific constraints into the logic blocks themselves in order to permit their effective use and, in particular, to be able to select them in writing mode.

By providing that the programming transistor is formed at least in part from the single block of phase-change materials common to all the memory zones of a given memory cell, the invention makes it possible to achieve solutions for these additional objectives. In fact, as indicated above, the memory cell of the invention is therefore autonomous and may be formed at the end of a method for an integrated circuit without demanding the addition of particular means therein, either for reading stored information or for programming it other than the necessary associated control logic, while nevertheless offering great flexibility in the positioning of memory cells relative to the logic blocks that use them. In this way greater freedom of design and use of integrated circuits would be possible.

Another aspect of the invention relates to an integrated circuit comprising a plurality of memory cells according to any one of the above characteristics.

Another aspect of the invention relates to a method for manufacturing a memory cell comprising: a step of formation of a single block of resistivity-change material; a step of establishing contact of the single block of resistivity-change material with at least two heating means, typically heating elements, each establishment of contact of a heating means with the resistivity-change material creating a memory zone therein. This memory zone is created in the vicinity of the heating means; a step of connection of each heating means with a supply line.

Preferably, the method comprises a step of producing a transistor for access to the memory cell from the single block of resistivity-change material. Advantageously, the step of producing the transistor comprises a step consisting in forming a collector of the transistor with the single block of resistivity-change material.

In this way, the method for manufacturing same is significantly simplified and the integration density is increased.

The other objects, characteristics and advantages of the present invention will become apparent upon examination of the following description and of the attached drawings. It is understood that other advantages may be incorporated.

BRIEF DESCRIPTION OF THE FIGURES

The purposes, objects, as well as the characteristics and advantages of the invention will become clearer from the detailed description of an embodiment thereof, which is illustrated by the following attached drawings, wherein:

FIG. 1b is an electrical diagram of the memory cell illustrated in FIG. 1a.

FIG. 3b is an electrical diagram of the memory cell illustrated in FIG. 3a.

Figure 1A:
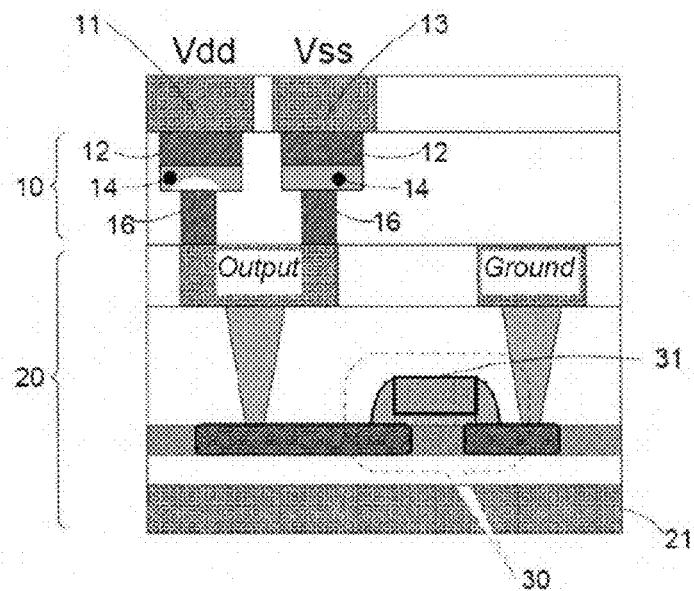
FIG. 1a describes, for comparison, an implementation of a known phase-change memory cell obtained at the end of the process for manufacturing a traditional integrated circuit.

The attached drawings are given by way of examples and are not limitative of the invention.

DETAILED DESCRIPTION OF THE INVENTION

Before a detailed description of exemplary embodiments of the invention is undertaken, what the invention provides according to one embodiment is evoked below, and several non-limitative but nevertheless advantageous characteristics are explained.

The invention provides a non-volatile memory cell containing at least two memory zones, each formed in a resistivity-change material configured to change state reversibly between at least two stable states having different electrical resistances, the memory cell containing at least one heating means associated with each memory zone, each heating means having at least two ends, one of which is connected to a supply line and the other of which is placed in contact with the resistivity-change material. Characteristically, the resistivity-change material is arranged in a single block common to each of the memory zones of the memory cell so as to create each of the memory zones locally, each of the memory zones being distinct from the other memory zones. In addition, the memory cell comprises an access transistor for programming the memory cell. Particularly advantageously, the transistor comprises a collector formed by the single block of resistivity-change material.

Alternatively, the memory cell according to the invention may have at least any one of the optional characteristics mentioned below.

Within the scope of the present invention, the resistivity-change material is a material conformed to switch from one stable resistive state to another stable resistive state, each state having a different resistivity. Since each state is stable when the material is forced into a given state, it remains in that state, unless it is intentionally modified, and it then exhibits the resistivity specific to that state.

Typically, the transition from one state to another state takes place by controlling the rise or fall of temperature of the resistivity-change material.

Typically, the resistivity-change material may be a phase-change material. In a first state, the material is in an amorphous phase. In a second state, the material is in a crystalline phase. Such a material therefore exhibits at least two stable resistive states having different resistivities. Possibly, in yet another state, the material is in yet another crystalline phase. It then has yet another resistivity. According to one embodiment, the invention relates to a phase-change memory. This type of memory is usually denoted as PCM, the English acronym for "phase change memory".

According to another embodiment, the invention relates to a resistive memory with random access. This type of memory is typically known by the name RRAM, the English acronym for "resistive random access memory".

According to another embodiment, the invention relates to a memory that uses metal oxides (Ox) as material whose resistance can be controlled reversibly. This type of memory is usually denoted by the name "OxRAM".

Also alternatively, the memory cell according to the invention additionally exhibits at least any one of the optional characteristics mentioned below.

The transistor is a bipolar transistor.

According to one embodiment, the resistivity-change material is doped to develop n-type conduction in order to constitute the collector of the transistor. The transistor comprises a base and an emitter made of doped metal oxides of respectively p-type and n-type, in order to form an npn transistor with the single block having the function of collector.

According to an alternative embodiment, the resistivity-change material is doped to develop p-type conduction in order to constitute the collector of the transistor. The transistor comprises a base and an emitter made of doped metal oxides of respectively n-type and p-type, in order to form a pnp transistor with the single block having the function of collector.

According to one embodiment, the base and the emitter are made of metal oxides superposed on the single block of resistivity-change material functioning as collector. The base and the emitter are, for example, deposited or embedded on the collector. Thus the base may be embedded or formed directly at the contact of the single block of resistivity-change material. The emitter in turn is preferably embedded or formed directly on the single block of resistivity change material.

According to an alternative embodiment, the base and the emitter are formed in the single block of resistivity-change material functioning as collector. Advantageously, they are obtained by successive doping of corresponding zones of the single block.

Advantageously, the single block of resistivity-change material constitutes an output electrode for reading information stored in the memory cell.

The memory zones are distinct from one another. The phase of each memory zone is controlled independently. In this way, the change of phase of one memory zone does not influence the phase of another memory zone.

A control electrode connected to the base in order to make a current flow from the independent supply lines through each of the heating means on the one hand, the collector and the emitter of the transistor on the other hand, so as to cause heating of the resistivity-change material in at least one of the memory zones, each of the memory zones being in contact with one end of the at least two heating means. In this way it is possible to cause a change of phase of the resistivity-change material in at least one of the memory zones.

Advantageously, the number of memory zones, the programmed resistance of the said memory zones and the voltage applied to each of the supply lines are arranged so that the memory cell is able to deliver electrical levels, typically voltage levels, that can be directly read by at least one electronic circuit in contact with the memory cell or in the immediate vicinity of the memory cell, typically an underlying electronic circuit.

Advantageously, the distinct memory zones are programmed such that together they constitute at least one voltage divider bridge comprising at least one resistance of high value in order to limit the current consumption of the memory cell and to make it possible to deliver, to the underlying electronic circuits, at least two distinct electrical levels close to the electrical levels applied on the independent supply lines. Typically, the electrical levels are voltage levels.

Advantageously, the memory cell comprises three memory zones. In this way the memory cell makes it possible to work in ternary logic while retaining a limited area.

Preferably, the phase-change material is chosen from among the following alloys: $Ge_2Sb_2Te_5$, GeTe, C-doped GeTe, N-doped GeTe, GeSb, GaSb, InGeTe, O-doped GST. Then the resistivity-change material is doped and the type of doping characterized (as described in FIG. 2).

The materials constituting the base and the emitter of the bipolar transistor (30) are chosen from among the following materials: p-doped CuO, n-doped IZO, Au—ZnO, Ag—ZnO, p-NiO-n-IZO, p-ZRO-n-ZnO, p-SCO-n-ZnO, poly Si.

According to a preferred embodiment, the resistivity-change material is a phase-change material. It is conformed to exhibit an amorphous phase in a first state and to exhibit a crystalline phase in at least one second state.

According to one embodiment, the memory cell comprises metal oxides (Ox), whose resistance may be controlled reversibly. According to one embodiment, the resistivity-change material is an oxide chosen from among the following oxides: cuprous oxide (CuO), silicon dioxide (SiO2), hafnium dioxide (HfO2), nickel oxide (NiO), zinc oxide (ZnO), aluminum oxide or alumina (Al2O3), vanadium dioxide (VO2) or even strontium titanate (SrTiO3).

It also is recalled that another aspect of the invention relates to an integrated circuit comprising a plurality of memory cells according to the invention.

Alternatively, the integrated circuit according to the invention exhibits at least any one of the characteristics and steps mentioned below.

Preferably, the integrated circuit comprises at least one electronic circuit in contact with the memory cell or in the immediate vicinity of the memory cell. Typically, the electronic circuit underlies the memory cell. In addition, it is configured so that the said memory cell delivers electrical levels that can be read directly by the at least one underlying electronic circuit.

Preferably, the number of memory zones, the resistance of the said memory zones and the voltage applied to each of the supply lines are configured to deliver electrical levels that can be read directly by the at least one electronic circuit underlying the memory cell.

Likewise preferably, the memory zones are programmed so that together they constitute at least one voltage divider bridge comprising at least one resistance of sufficiently high value that at least two distinct electrical levels can be delivered to the underlying electronic circuits. Preferably, these levels are close to the electrical levels applied to the supply lines. Advantageously, that also makes it possible to limit the current consumption of the memory cell.

In one particular embodiment, the memory cells are associated with access means, also referred to as access devices, configured to access the memory cells randomly. In this way the integrated circuit forms a resistive random access memory (RRAM). Advantageously, the access time is then substantially the same for each of the memory cells among a plurality of cells.

It also is recalled that another aspect of the invention relates to a method for manufacturing a memory cell comprising: a step of formation of a single block of resistivity-change material; a step of establishment of contact of the single block of resistivity-change material with at least two heating means, each establishment of contact of a heating means with the resistivity-change material creating a memory zone in the latter. This memory zone is created in the vicinity of the heating means; a step of connection of each heating means to a supply line.

Preferably, the method comprises a step of producing a transistor for access to the memory cell from the single block of resistivity-change material. Advantageously, the step of producing the transistor comprises a step consisting of forming a collector of the transistor with the single block of resistivity-change material.

In addition, the method according to the invention alternatively exhibits at least any one of the characteristics and steps mentioned below.

Preferably, the method includes a step of forming a base and an emitter of the transistor.

Preferably, the steps of forming the base and the emitter comprise deposits of doped oxides on the surface of the single block of resistivity-change material.

According to another embodiment, the base and the emitter are formed in the single block of resistivity change material and are obtained successively by doping corresponding zones of the single block. For example, the transistor base is formed in the single block of resistivity-change material constituting the collector, then optionally and advantageously the transistor emitter is formed in the base.

In this way the method includes doping steps performed so that the transistor is of npn or pnp type.

Advantageously, all steps are performed at a temperature that is not capable of damaging the already manufactured components and in particular the metallic interconnections that are formed at the end of the line, in steps of the manufacturing process generally referred to as BEOL, as discussed in the above. This temperature is in any case lower than the lowest of the temperatures used at the end of the line. Typically, all the steps are performed at a temperature lower than or equal to 450 T° C. and preferably lower than or equal to 400 T° C. In this way, the group of steps is carried out at low temperature; low temperature is described as a temperature lower than 400 T° C.

Likewise advantageously, all steps are performed at the end of formation of at least one underlying electronic circuit.

In this way, the steps are carried out at low temperature without disadvantages for the underlying circuit and its interconnections.

Figure 1B:
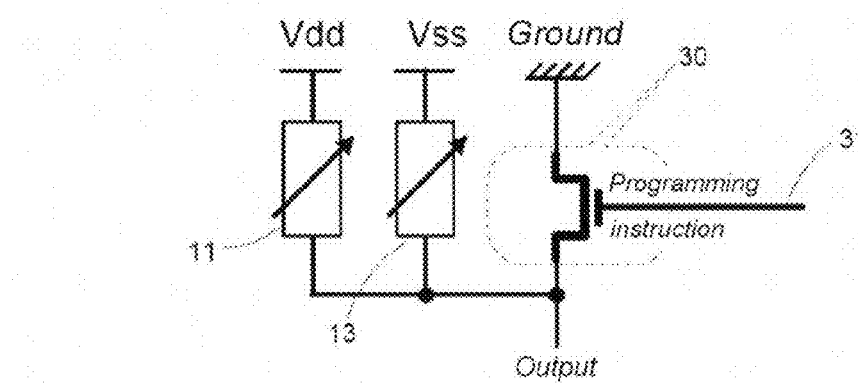

FIGS. 1a and 1b describe, for comparison, a known implementation of a phase-change memory cell 10 achieved at the end of the process for manufacturing a traditional integrated circuit 20. FIG. 1a is a view in section of the memory cell, and FIG. 1b is the corresponding electrical diagram.

In this type of implementation, the integrated circuit is traditionally formed from a silicon substrate 21 and comprises a more or less large number of superficial layers which may be formed optionally by very varied means used in standard manner by the microelectronics industry. These means include, among others, epitaxy, high-temperature diffusion of dopants, thermal oxidation of the silicon, deposition of diverse materials, in particular the metal used for the interconnections, and implantation of the silicon dopant products by ion bombardment. In these layers, patterns are defined in each step by lithography, in order to form all the components of the integrated circuit. The components are typically field effect transistors of the metal oxide semiconductor type (MOS). Most often, two complementary types of MOS transistors are formed simultaneously, one with an n-type channel and the other with a p-type channel, leading to the technology known as CMOS, widely used by the microelectronics industry for production of the most complex integrated circuits with the highest performances.

In this example, memory cell 10, which is obtained at the end of the process for manufacturing the integrated circuit, and therefore above the corresponding layers 20, comprises the two devices 11 and 13, each including a portion of a resistivity-change material 14, 14. The resistivity of each of the portions may be modified reversibly by making a controlled current pass through devices 11 and 13. Patterns 16, 16, situated underneath the two portions of resistivity-change material 14, 14, constitute the heating means capable of locally producing the heat necessary for the resistivity-change material to transition from one resistive state to another resistive state. The heating means are also referred to as heating elements. The patterns situated above the two portions of resistivity-change material 14, 14 are the upper electrodes 12 of the devices constituting the memory cell and are connected to two different supply lines, which may be connected to two different voltages, denoted here by Vdd and Vss, of the integrated circuit.

Programming of the memory cell, or in other words writing thereof, requires that an access device be present for each memory cell, in order to control the current that will be forced to pass through one and the other of devices 11 and 13 so as to make the portions of resistivity-change material 14, 14 transition from one resistive state to another resistive state, with the aid of heating means 16, 16.

Conventionally, this access means is a transistor 30, which must then be implanted in the underlying circuits—in this case an MOS transistor which will be made conductive in writing mode by applying a voltage to its control gate 31, in order to make the programming current flow between supply line Vdd and ground for device 11 on the one hand and between supply line Vss and ground for programming of device 13 on the other hand.

In this conventional embodiment, as far as writing is concerned, each memory cell therefore remains dependent on the underlying circuits, in which there must be implanted as many access devices as there are phase-change memory cells used.

Figure 2A:
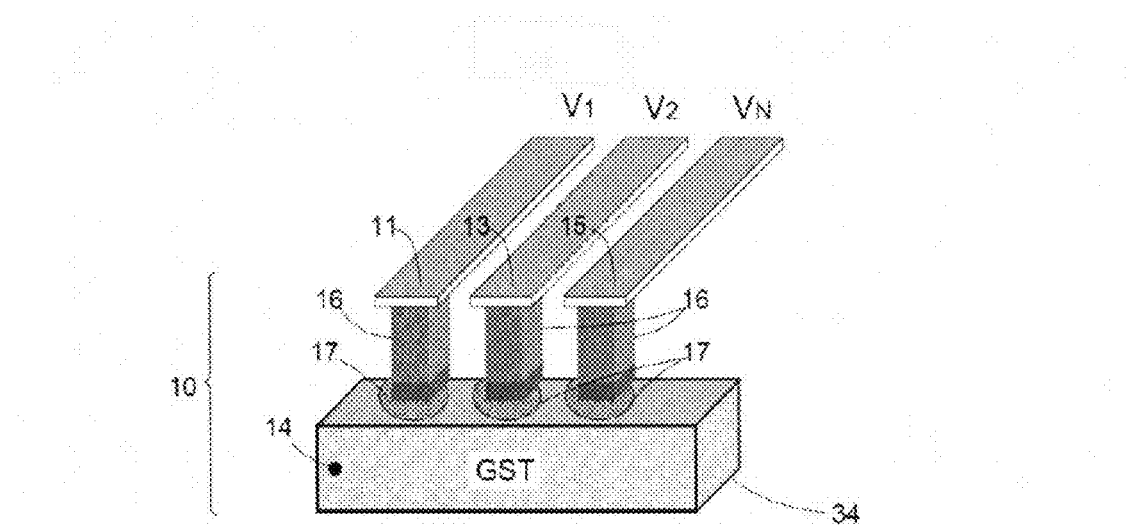
FIG. 2a describes the structure of a memory cell portion according to one exemplary embodiment of the invention.
Figure 2B:
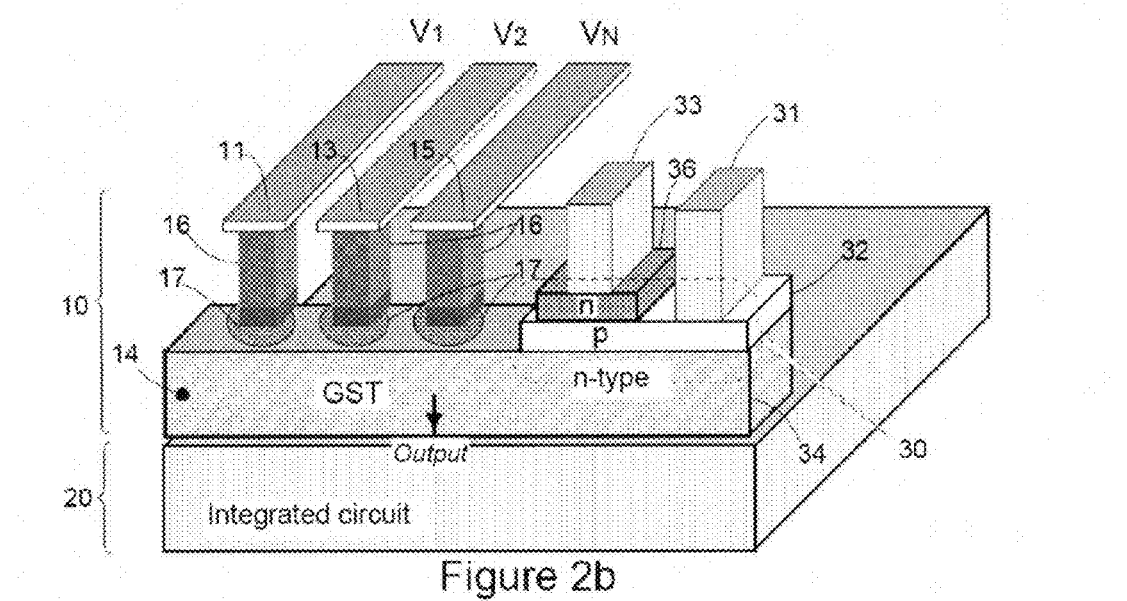
FIG. 2b describes the structure of an autonomous phase-change memory cell according to a first exemplary embodiment of the invention that includes its own access device for programming the cell and that may be entirely formed at the end of the process for manufacturing a traditional integrated circuit.
Figure 2C:
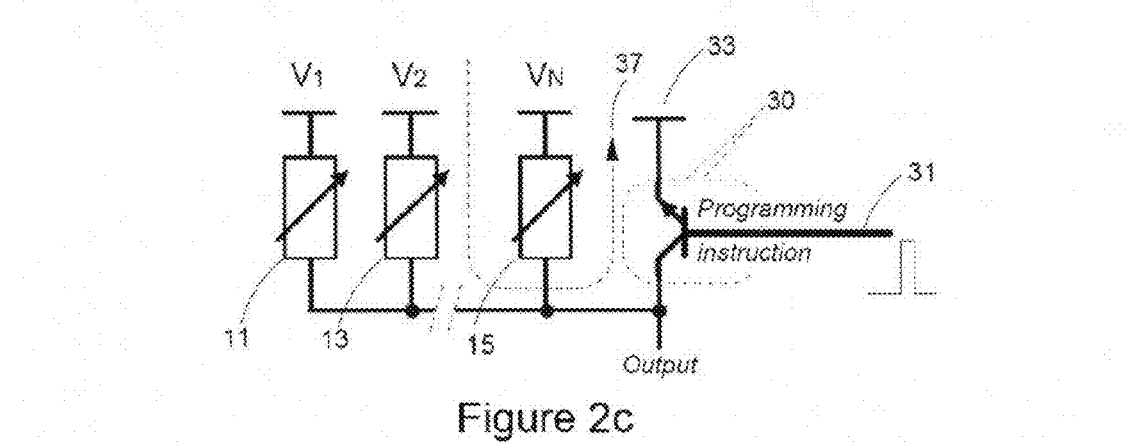
FIG. 2c is an electrical diagram of the memory cell illustrated in FIG. 2b.

FIG. 2 describes the structure of a phase-change memory cell according to the invention and addressing this problem. FIG. 2a is a view in section of memory storage elements. FIG. 2b shows how, in a first implementation of the invention, the device for access in writing mode and the memory storage elements are interleaved to form an autonomous memory cell. FIG. 2c is the corresponding electrical diagram.

As shown in FIG. 2a, resistivity-change material 14, typically of GST, this time forms a single common block 34, which can then be shared between all the variable-resistance elements of a memory cell 10, making it possible to increase the integration density. This sharing also makes it possible to avoid limiting the number of these elements to two, as was the case in FIG. 1. By way of example, three devices: 11, 13 and 15 are represented, which make it possible to define more than two states and thus to increase the storage capacity of the memory cell at the cost of a slight enlargement of its area. There are as many heating means 16 as devices. They make it possible to define, in single common block 34, independent zones 17 in which it will be possible to control the resistance of the material individually. The devices then are each supplied with a specific supply voltage $V_1, V_2, \ldots, V_N$.

The formation of block 34 of resistivity-change material 14 is not limited to the use of GST mentioned in the prior art section. Other alloys such as: GeTe, C-doped GeTe, N-doped GeTe, GeSb, GaSb, InGeTe, O-doped GST and N-doped GST may be used advantageously. The component materials of the above alloys and their dopants are denoted with the aid of their respective standardized chemical symbol. In other words, in the order in which they are cited: germanium (Ge), tellurium (Te), carbon (C), nitrogen (N), antimony (Sb), gallium (Ga), indium (In) and oxygen (O). The role of dopants is to endow the cited alloys with properties favorable for use thereof as resistive memory elements: ease of programming of a resistive state, retention of this resistive state during successive reading cycles, and shortening of reading and writing times.

As shown in FIG. 2b, the invention solves the problem of selection of the memory cell for its programming by integrating the access means from block 34 of resistivity-change material 14 itself in order to make it autonomous.

Depending on the processing mode used, the GST or the chosen resistivity-change material may be considered as initially doped, even if no dopant was added during processing thereof. The resistivity-change material is formed, for example, by chemical or physical vapor phase deposition. The apparent doping then results from the deposition method used. The doping may also originate from the input of a specific dopant, typically in gaseous form during deposition. Regardless of the processing mode adopted for formation of resistivity-change material 14, the invention requires that it be doped, in this first implementation of the invention, in order to develop a type of conduction by excess electrons, or in other words n-type. In this way, block 34 will be able to constitute the collector of a bipolar transistor 30 with junction of npn type. A transistor which, as discussed above, will be able to function as access device for programming the memory cell without need to resort to components of the underlying integrated circuit as described in FIG. 1.

In this first implementation, base 32 of the transistor is formed by deposition of a layer of material doped as p-type, in order to develop conduction by holes or electron deficiencies. It is an oxide of copper (p-doped CuO), for example, that constitutes a first heterojunction with the GST of the collector.

Emitter 36 of the transistor is deposited on base 32 to form a layer of material doped as n-type. Once again it is an oxide, for example that of an alloy of indium and zinc (n-doped IZO), that will constitute the second heterojunction of bipolar transistor 30.

In this way the transistor of npn-type for access to the memory cell is made of GST or of a phase-change material, and of doped oxides. The steps of forming the access transistor and those for forming the memory cell in general all take place from deposition of corresponding materials at so-called low temperatures that do not exceed 450° C. or even 400° C. Which is compatible with the process for manufacturing the underlying integrated circuit and does not risk damaging the components thereof, and especially the already formed metallic interconnection lines.

The formation of the transistor is not limited to the use of the oxides mentioned above. Other oxides and materials may be used advantageously for the base and emitter, such as: Au—ZnO, Ag—ZnO, NiO—IZO, ZRO—ZnO, SCO—ZnO, poly Si, in order to form heterojunctions of pn or Schottky type, or in other words metal-semiconductor junctions, at low temperature. The oxides and materials above are denoted the aid of their respective standardized chemical symbol. That is to say, in the order in which they are cited: gold (Au), zinc oxide (ZnO), silver (Ag), nickel oxide (NiO), indium zinc alloy oxide (IZO).

The techniques used for doping of materials include vapor phase deposition and ion implantation. Vapor phase deposition permits in-situ doping to be carried out, in which case the doped layer can be constructed both above and below the intrinsic (undoped) layer. However, it is difficult to control the concentrations and profiles of the dopants. The doping process requires characterization, especially such as that mentioned below, which makes it possible to apply the necessary corrections afterwards. In contrast, ion implantation permits good control of the concentrations and profiles of dopants.

Furthermore, if the annealing temperature necessary to activate the dopants is too high relative to the heat budget permitted for the operations of the manufacturing process carried out at the end of the line (<400° C.), it is possible to resort to implantation techniques with high ion current, which nevertheless necessitate only very low energies in order to avoid annealing at high temperature. Techniques which have been described, for example, in the MSIB system by K. Yamamoto, Surface Science 600, 2006, 3753-3756.

One material used as dopant for phase-change materials is, for example, oxygen (O). K. B. Song, in "Applied Physics Letters (APL)", 93, 043514, 2008, can be consulted in this regard. Zinc (Zn) and gallium (Ga) are also n-type dopants for phase-change materials such as: zinc selenide (ZnSe), zinc sulfide (ZnS) or their association ZnS/ZnSe. Kun et al. in U.S. Pat. No. 3,670,220 can be consulted in this regard.

The type of conductivity of the resistivity-change material used may be determined by different characterization methods, which include:
Measurements based on the Hall effect.
Thermoelectric experiments using the Seebeck effect.
Rectification methods.
Optical techniques developing surface tensions.

The equivalent doping of the material with intrinsic resistivity change may also be determined by measurements of capacitance as a function of voltage (CV).

The further improvement of the doping process may then be achieved on the basis of the results above by using the well known theory of pn junctions. The electrical permittivity may be simply deduced from measurements performed on a capacitor forming a stack or sandwich, in which the doped resistivity-change material constitutes the insulator.

In general, all the experimental techniques of "trial and error" type, with successive approximations, may be used to determine the appropriate doping doses.

The details of these characterization methods may be found in D. K. Schroder, "Semiconductor materials and device characterization", 3rd edition IEEE Press, 2006.

Finally, as already discussed above, it may be seen in FIG. 2b that access device 30 is now an integral part of memory cell 10. It will make it possible to control the current 37 that will be forced to flow through devices 11, 13 and 15 in order to make material 14 transition from one resistive state to another resistive state during programming of the memory cell. The transition of the resistivity-change material from one resistive state to another resistive state takes place locally at the position of each of heating means 16, which are connected directly to supply lines $V_1$, $V_2$ and $V_N$ in this new structure. Thus the programming current flows between the supply lines and emitter 36 of the bipolar transistor, which is itself connected to a low voltage 33, for example the ground of the device. By benefiting from the amplification of the transistor, a small control current 31 injected into base 32 makes it possible to achieve this result.

Figure 3A:
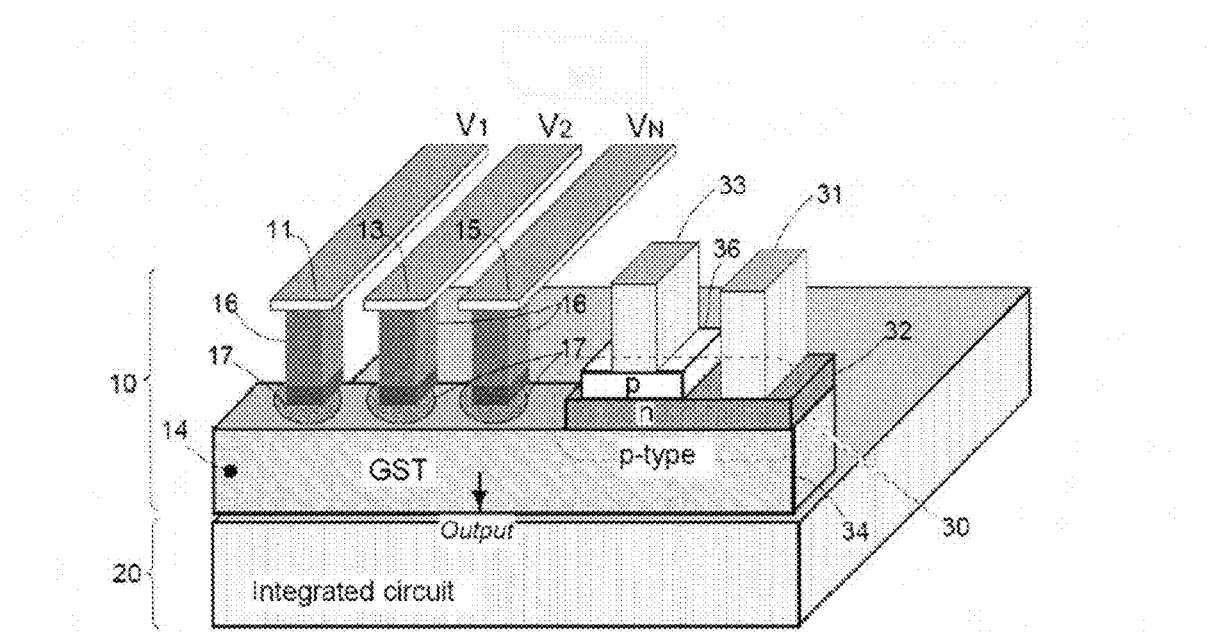
FIG. 3a describes a second exemplary embodiment of an autonomous phase-change memory cell according to the invention.
Figure 3B:
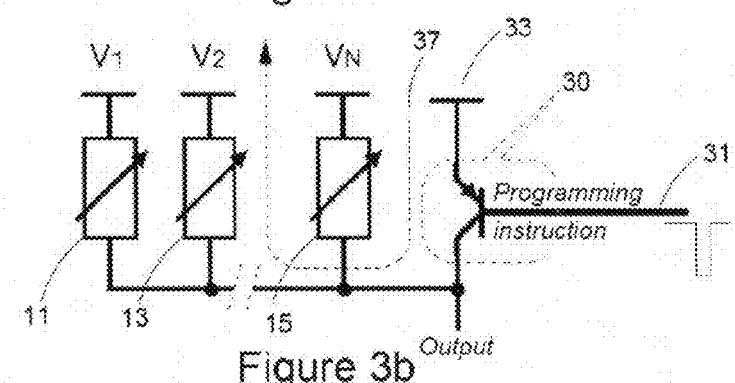

FIG. 3, which consists of FIGS. 3a and 3b, describes a second implementation of the invention, in which the access device this time is a transistor 30 of pnp type.

The process of processing the memory zones and the access transistor is generally the same as that described in FIG. 2. In order to be able to form a pnp transistor (instead of an npn transistor), single block 34 of resistivity-change material 14 must now have been processed initially or must be doped to develop p-type conduction mode, or in other words an electron-deficiency conduction mode, in order also to constitute, as above, the collector of transistor 30. Base 32 and emitter 36 are also deposited oxides, which may be chosen from among the materials cited in the description of FIG. 2.

For example, an oxide of copper (p-doped CuO) may form emitter 36 this time, while an oxide of an indium and zinc alloy (n-doped IZO) will constitute the base.

FIG. 3b represents the electrical diagram of the cell described above. Since the transistor is of the type opposite to the foregoing case, current 37 for programming the resistances will flow from an electrical level 33 higher than that of supply lines V1, V2 and VN.

Figure 4:
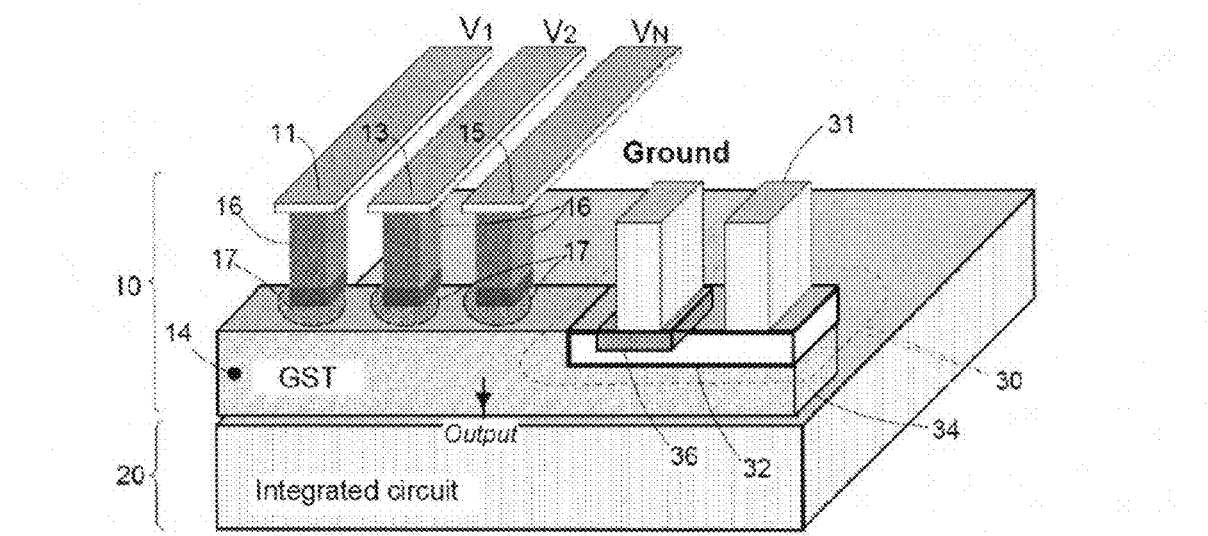
FIG. 4 describes a third exemplary embodiment of an autonomous phase-change memory cell according to the invention.

FIG. 4 illustrates a third implementation of the invention, in which base 32 and emitter 36 are not obtained by successive deposits of oxides as described above but result from successive doping of corresponding zones of block 34 of resistivity-change material 14 used. As in the foregoing cases, depending on the respective doping of the collector, base and emitter zones, it will be possible to produce the two types of bipolar transistors, or in other words npn and pnp, which correspond to the electrical diagrams of FIGS. 2c and 3b respectively.

The doping of single block 34 making it possible to obtain the structure of transistor 30 illustrated by FIG. 4 is typically achieved by physical vapor phase deposition or by successive ion implantation of dopants in block 34. As already mentioned in the description of FIG. 2, control of doping levels may be achieved more easily by ion implantation. Nevertheless, the implementation of techniques for characterization of the doping obtained, also described in FIG. 2, also makes the use of physical vapor phase deposits possible. In addition, as described, low-temperature annealing may also be performed.

The materials used to dope block 34 of phase-change material are those already mentioned in the description of FIG. 2. They are therefore especially oxygen (O), zinc (Zn), gallium (Ga), zinc selenide (ZnSe), zinc sulfide (ZnS) or their association ZnS/ZnSe.

Regardless of the mode of implementation of the invention, the output electrode of the memory cell consists of block 34 of resistivity-change material 14. It will be noted that, in this structure, the inverse of that of FIG. 1, the output of the memory cell is directly accessible from the components of underlying integrated circuit 20. The memory cells may therefore be placed closer to their use and do not necessitate the addition of any selection component in the integrated circuit, in this way meeting the objectives of the invention.

In addition, phase-change memory cells 10 are therefore produced at the end of the process for manufacturing underlying integrated circuit 20 and at temperatures that do not exceed 400° C. In this way the invention makes it possible to simplify significantly the methods for obtaining integrated circuits incorporating memory cells.

Figure 5A:
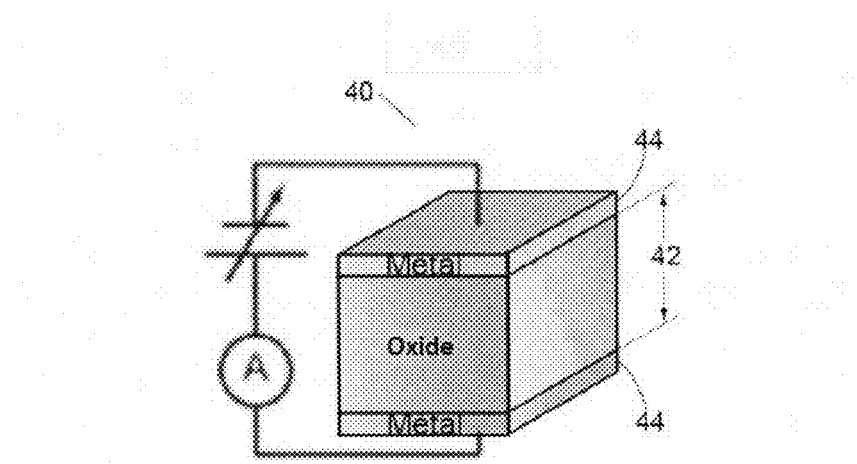
FIG. 5a shows a resistive memory of OxRAM type.
Figure 5B:
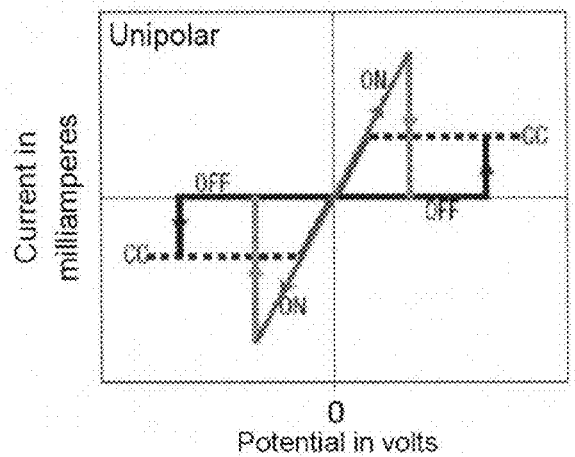
FIGS. 5b and 5c illustrate two different modes of functioning of memories of OxRAM type.
Figure 5C:
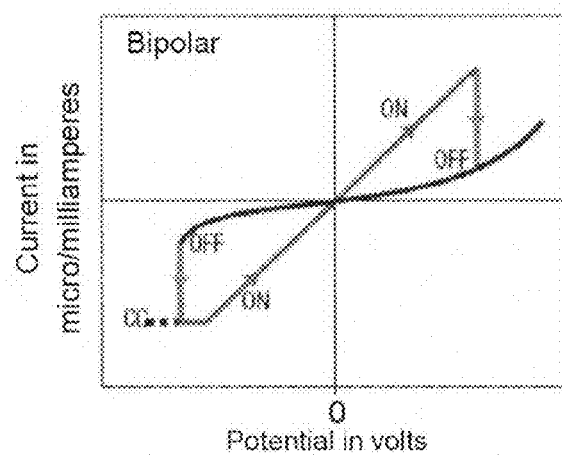

As indicated above, the invention may be applied to resistive memories of the OxRAM type. FIG. 5, which comprises FIGS. 5a to 5c, briefly describes the functioning of resistive memories of OxRAM type mentioned above. FIG. 5a shows the structure of such a memory 40, which is made of an oxide 42 between two metal electrodes 44 constituting a structure known as MIM, or in other words metal-insulator-metal.

The OxRAM memories function in two distinct modes depending on the materials used. The behavior may be unipolar or bipolar, as shown in FIGS. 5b and 5c respectively. The switching resistance of an OxRAM memory element corresponds to an abrupt change between a high-resistance state denoted as OFF and a low-resistance state denoted as ON. The change of resistance is obtained by applying a voltage V higher than a threshold voltage $V_T$.

After electro-formation, which corresponds to the switching of resistance induced by the voltage from a high-resistance state to a conductive state of the film such as deposited, the application of unipolar or bipolar scanning voltages makes it possible to produce reversible resistance changes in the capacitance MIM, leading to the development of I-V curves, or in other words current-voltage curves, which exhibit hysteresis characteristics.

Switching is said to be non-polar or unipolar when the switching procedure does not depend on the polarity of the voltage and current signals. A system in its high-resistance state (OFF) is switched (reinitialized) by a threshold voltage in the low-resistance state (ON), as shown in FIG. 5b. The current is limited by the conformity current of the control circuit. Return to the OFF state takes place at a higher current and for a lower voltage than the reinitialization voltage.

In contrast, the characteristic is known as bipolar or anti-symmetric when reinitialization in the ON state takes place for one voltage polarity and the return to the OFF state takes place for the inverse voltage polarity, as shown in FIG. 5c. The structure of the system must exhibit a certain asymmetry, such as, for example, different electrode materials, or the polarity of the voltage in the electro-formation step, in order that the bipolar switching behavior can be observed. For both characteristics, unipolar and bipolar, reading of the state takes place at low voltages that should not affect that state.

The major difference between these two types of memories lies in the way in which they are programmed. Within the scope of the invention, the memories are programmed by a programming unit adapted to deliver programming signals appropriate for the technology. Since functioning of the memory cell in static regime is based on the resistive states, this cell is not modified but remains subjected to voltages lower than the memory switching threshold. In the case of a unipolar memory, the threshold is on the order of 0.6 volt, whereas in the case of a bipolar memory the threshold is greater than 2 volts. Thus the bipolar memory allows more maneuvering room. Both the bipolar and unipolar memories are compatible with implementation of the invention.

As illustrated in FIGS. 2a to 3b, the invention provides the possibility of creating a ternary logic point. Of course, the adoption of ternary logic necessitates the use of devices themselves functioning in ternary logic, which implies that if the output of the memory cell has three states, the input of the underlying logic cell must also have three states. The emergence of new technologies such as that of carbon nanotube transistors, in which it must be possible to apply three electrical levels to their rear gate, for example −1 volt, 0 volt and 1 volt, opens the way to such applications of the invention.

The functioning of the ternary logic point is as follows: one of the three memories is programmed to be conductive and to have a low resistance Ron, while the other two are maintained at an elevated resistance Roff. The result is a voltage divider in the same way as in the binary case. The value of the state during output, in the case in which the low-resistivity memory is connected to the potential V1, is the following:

$$Vout = \frac{\frac{V1}{Ron} + \frac{V2}{Roff} + \frac{V3}{Roff}}{\frac{1}{Ron} + \frac{2}{Roff}} \approx V1$$

This may be extended to other cases of n-ary logic. It is sufficient to add a memory and a different logic onto the associated supply rail.

Figure 6:
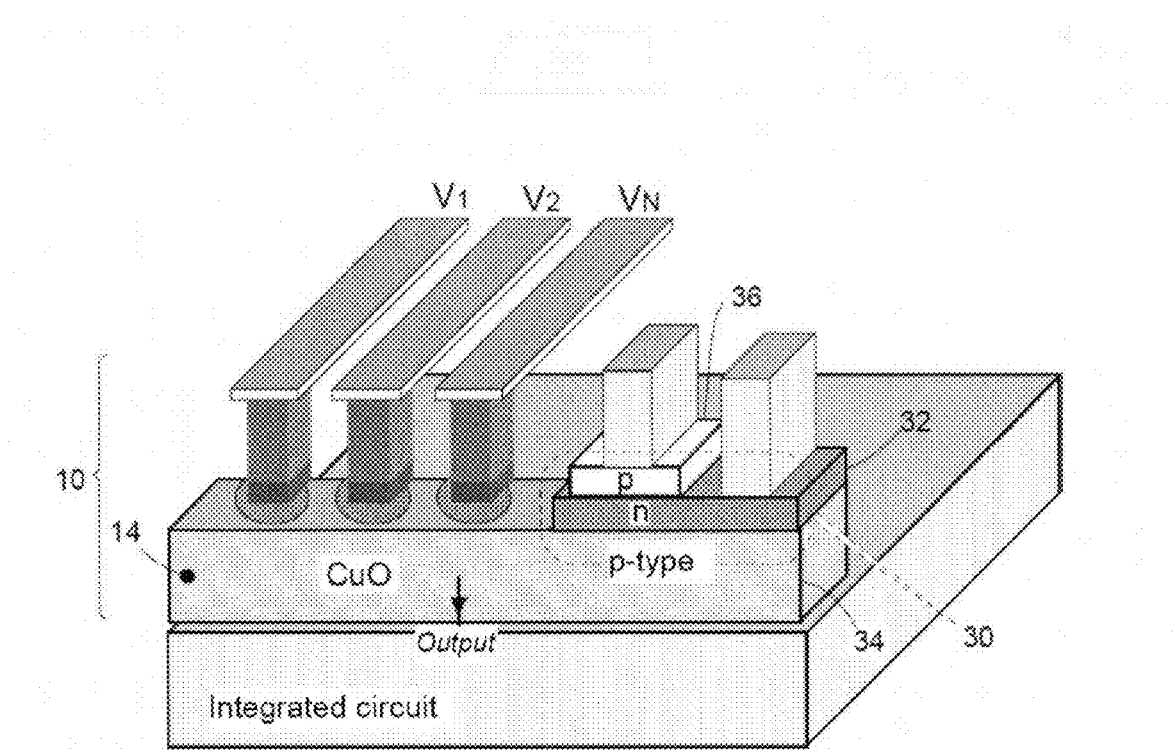
FIG. 6 illustrates the production of an exemplary memory cell of OxRAM type corresponding to a structure of a memory cell of the invention.

FIG. 6 illustrates the construction of a memory cell of OxRAM type corresponding to the cell structure of the invention described above in FIGS. 2 and 3. In this implementation of the invention, the single block 34, constituting the collector of bipolar transistor 30, is therefore no longer constituted this time by a phase-change material 14 but by an oxide.

As already mentioned, cuprous oxide (CuO), which develops p-type conduction, and indium zinc alloy oxide (IZO), which develops n-type conduction, will be advantageously used to construct the memory cell illustrated by FIG. 6. Cell 10 then has a single block 34 forming the collector made of cuprous oxide CuO. Base 32 and emitter 34 of the bipolar transistor are constituted respectively of IZO and CuO, thus forming a pnp transistor. The electrical diagram of the cell illustrated by FIG. 6 is therefore the same as that described in FIG. 3b.

The construction of an OxRAM memory cell in conformity with FIG. 6 may be extended to the use of any compatible material, including the following oxides, which prove particularly advantageous: silicon dioxide (SiO2), hafnium dioxide (HfO2), nickel oxide (NiO), zinc oxide (ZnO), aluminum oxide or alumina (Al2O3), vanadium dioxide (VO2) or even strontium titanate (SrTiO3).

The invention is not limited to the embodiments described above, but extends to any embodiment in conformity with the spirit thereof.

The invention claimed is:

1. A non-volatile memory cell containing at least two distinct memory zones, each formed in a resistivity-change material capable of changing state reversibly between at least two stable states having different electrical resistances, the memory cell comprising at least one heating element for each memory zone, each heating element having at least two ends, one end being connected to a supply line and another end being in contact with the resistivity-change material, wherein the resistivity-change material is arranged in a single block common to each of the memory zones of the memory cell, in such a way as to create distinct memory zones locally, and wherein the memory cell comprises an access transistor for programming the memory cell, the transistor comprising a collector formed by the single block of resistivity-change material.

2. A memory cell according to claim 1, wherein the transistor comprises a base and an emitter constituted of metal oxides superposed on the single block of resistivity-change material.

3. A memory cell according to claim 2, wherein the materials constituting the base and the emitter of the transistor are chosen from among the following oxides: p-doped CuO, n-doped IZO, Au—ZnO, Ag—ZnO, NiO—IZO, ZRO—ZnO, SCO—ZnO, poly Si.

4. A memory cell according to claim 1, wherein the transistor comprises a base and an emitter, and wherein the base and the emitter are formed in the single block of resistivity-change material.

5. A memory cell according to claim 1, wherein the single block of resistivity-change material constitutes an output electrode for reading information stored in the memory cell.

6. A memory cell according to claim 1, wherein the resistivity-change material is chosen from among the following alloys: Ge2Sb2Te5, GeTe, C-doped GeTe, N-doped GeTe, GeSb, GaSb, InGeTe, O-doped GST.

7. A memory cell according to claim 1, wherein the resistivity-change material is an oxide chosen from among the following oxides: cuprous oxide (CuO), silicon dioxide (SiO2), hafnium dioxide (HfO2), nickel oxide (NiO), zinc oxide (ZnO), aluminum oxide or alumina (Al2O3), vanadium dioxide (VO2) or even strontium titanate (SrTiO3).

8. A memory cell according to the preceding claim, wherein the resistivity-change material is doped to develop either n-type or p-type conduction in order to constitute the collector of the transistor.

9. A memory cell according to claim 1, comprising at least three memory zones.

10. A memory cell according to claim 1, comprising a control electrode connected to the base and configured to make a current flow from the supply lines through each of the heating elements, and the collector and the emitter of the transistor, so as to cause heating of said resistivity-change material in at least one of the memory zones.

11. A memory cell according to claim 1, wherein the resistivity-change material is conformed to exhibit an amorphous phase in a first state and to exhibit a crystalline phase in at least one second state.

12. An integrated circuit comprising a plurality of memory cells according to claim 1.

13. An integrated circuit according to claim 12, containing at least one electronic circuit underlying a memory cell and configured so that said memory cell delivers electrical levels that can be read directly by the at least one underlying electronic circuit.

14. An integrated circuit according to claim 13, wherein the number of memory zones, the resistance of said memory zones and the voltage applied to each of the supply lines are configured to deliver electrical levels that can be read directly by the at least one electronic circuit underlying the memory cell.

15. An integrated circuit according to claim 12, wherein the memory cells are associated with access means configured to access the memory cells randomly.

16. An integrated circuit according to claim 12, wherein the memory zones are programmed so that together they constitute at least one voltage divider bridge comprising at least one resistance of sufficiently high value to deliver, to the underlying electronic circuits, at least two distinct voltage levels close to the electrical voltages applied to the independent supply lines.

17. A method for manufacturing a memory cell, the method comprising the steps of:
   forming a single block of resistivity-change material;
   establishing contact of the single block of resistivity-change material with at least two heating elements,
   connecting each heating element to a supply line,
   constructing a transistor for access to the memory cell, said constructing comprising forming a collector of the transistor with the single block of resistivity-change material.

18. A method according to claim 17, comprising steps of forming a base and of an emitter of the transistor, said forming a base and an emitter comprising depositing doped oxides successively from the surface of the single block of resistivity-change material.

19. A method according to claim 17, comprising steps of forming a base and an emitter of the transistor, wherein the base and the emitter are formed in the single block of resistivity-change material and are obtained successively by doping zones of the single block.

20. A method according to claim 19, wherein the emitter is formed in the single block of resistivity-change material.

21. A method according to claim 17, wherein the steps are carried out at a temperature lower than 450 T° C.

22. A method according to claim 17, wherein the steps are carried out after forming at least one electronic circuit underlying the memory cell.

* * * * *